US011945660B2

(12) United States Patent
Schlezinger et al.

(10) Patent No.: US 11,945,660 B2
(45) Date of Patent: Apr. 2, 2024

(54) LINEAR SORTER USING VACUUM BELT

(71) Applicant: Applied Materials, Inc., Santa Clara, CA (US)

(72) Inventors: Asaf Schlezinger, Modi'in (IL); Markus J. Stopper, Voerstetten (DE)

(73) Assignee: Applied Materials, Inc., Santa Clara, CA (US)

( * ) Notice: Subject to any disclaimer, the term of this patent is extended or adjusted under 35 U.S.C. 154(b) by 63 days.

(21) Appl. No.: 17/396,933

(22) Filed: Aug. 9, 2021

(65) Prior Publication Data

US 2023/0038811 A1 Feb. 9, 2023

(51) Int. Cl.
*B65G 47/71* (2006.01)
*B07C 5/36* (2006.01)
*B65G 21/20* (2006.01)

(52) U.S. Cl.
CPC .............. *B65G 47/71* (2013.01); *B07C 5/363* (2013.01); *B65G 21/2036* (2013.01); *B65G 2201/022* (2013.01); *B65G 2207/18* (2013.01)

(58) Field of Classification Search
CPC ..................................................... B65G 47/71
USPC ........................................................ 209/606
See application file for complete search history.

(56) References Cited

U.S. PATENT DOCUMENTS

| 6,446,789 B1* | 9/2002 | Goodman | .......... B65G 21/2036 198/689.1 |
|---|---|---|---|
| 10,092,929 B2 | 10/2018 | Bonora et al. | |
| 10,406,562 B2 | 9/2019 | Stopper et al. | |
| 10,507,991 B2 | 12/2019 | Schlezinger et al. | |
| 10,777,436 B2 | 9/2020 | Stopper et al. | |
| 11,072,502 B2 | 7/2021 | Schlezinger et al. | |
| 2010/0126415 A1* | 5/2010 | Ishino | ............... H01L 21/67748 118/500 |
| 2013/0008836 A1 | 1/2013 | Jung et al. | |
| 2014/0338828 A1 | 11/2014 | Lee et al. | |
| 2019/0344980 A1 | 11/2019 | Schlezinger et al. | |
| 2021/0096169 A1 | 4/2021 | Schlezinger et al. | |
| 2021/0163249 A1* | 6/2021 | Krapf | ..................... B65H 31/10 |
| 2022/0189808 A1 | 6/2022 | Schlezinger et al. | |

FOREIGN PATENT DOCUMENTS

| CN | 111540703 A | 8/2020 |
|---|---|---|
| EP | 3514825 A1 | 7/2019 |
| JP | 2008064666 A | 3/2008 |
| KR | 20100104068 A | 9/2010 |

OTHER PUBLICATIONS

International Search Report and Written Opinion for PCT/US2022/036564 dated Dec. 13, 2022.

* cited by examiner

*Primary Examiner* — Jacob S. Scott
*Assistant Examiner* — Miraj T. Patel
(74) *Attorney, Agent, or Firm* — Patterson + Sheridan, LLP (57) ABSTRACT

Embodiments of the present disclosure generally relate an apparatus for inspecting and sorting a plurality of substrates. The apparatus includes a sorting unit, a first conveyor lane disposed within the sorting unit in a first direction and a first plane, and at least a second conveyor lane disposed within the sorting unit, the second conveyor lane positioned in a second direction at an angle of greater than about 45 degrees relative to the first direction, wherein the second conveyor lane is positioned in a second plane that is different than the first plane.

18 Claims, 5 Drawing Sheets

LINEAR SORTER USING VACUUM BELT

BACKGROUND

Field

Embodiments of the present disclosure generally relate to solar substrate inspection equipment. More specifically, embodiments disclosed herein relate to a system and method for the high speed sorting of substrates.

Description of the Related Art

Substrates, such as semiconductor substrates or solar substrates, are routinely inspected during processing at independent inspection stations to ensure compliance with predetermined quality control standards. Different inspection techniques provide comprehensive data regarding products and processes. However, comprehensive inspections can be time consuming, thus reducing throughput, due to the number of inspection stations required and the resulting transfer time of moving substrates therebetween. Thus, device manufacturers are often faced with the decision of choosing between thorough inspections with burdensome inspection/transfer times, or foregoing certain inspection processes.

Typical sorting systems sort approximately 3,600 substrates per hour in a linear arrangement. These conventional systems use a single linear conveyor in a single plane, and inspected substrates are deposited in bins lightly offset from the single conveyor. To prevent collisions between adjacent substrates traveling on the conveyor in the single plane, there is a large spacing between these substrates. However, the large spacing limits throughput and may also increase the tool footprint. In addition, as inspection processes have continued to decrease the amount of time required to complete the required inspection steps, sorting apparatuses able to keep up with faster sortings are needed to increase throughput.

As the foregoing illustrates, there is a need for an improved substrate inspection system for sorting inspected substrates at increased speeds and allowing for higher throughputs. Therefore, what is needed in the art is a high speed linear sorter.

SUMMARY

Embodiments of the present disclosure generally relate an apparatus for sorting a plurality of substrates. In one embodiment, the apparatus includes a first conveyor lane arranged in a first direction and a first plane, the first conveyor lane adapted to receive substrates from a metrology unit, and at least a second conveyor lane partially disposed over the first conveyor lane, the second conveyor lane oriented in a second direction relative to the first direction selected to allow substrates transferred from the first conveyor lane to the second conveyor lane to move laterally clear of the first conveyor lane, wherein the second conveyor lane is positioned in a second plane that is different than the first plane.

In another embodiment, an apparatus adapted to inspect and sort substrates is disclosed. The apparatus includes a metrology unit, a first conveyor lane arranged in a first direction and a first plane, the first conveyor lane configured to receive substrates from the metrology unit, and at least a second conveyor lane partially disposed over the first conveyor lane, the second conveyor lane oriented in a second direction relative to the first direction selected to allow substrates transferred from the first conveyor lane to the second conveyor lane to move laterally clear of the first conveyor lane, wherein the second conveyor lane is positioned in a second plane that is different than the first plane.

In yet another embodiment, a method of operating an apparatus for inspecting and sorting a plurality of substrates is disclosed. The method includes transporting a plurality of substrates on a main conveyor lane exiting a metrology unit in a first direction, vacuum picking a first substrate of the plurality of substrates from the main conveyor of a first sorting lane, the first sorting lane extending over a plurality of bins, transporting the first substrate laterally clear of the first conveyor, and releasing the first substrate into a selected one of the bins based on an inspection characteristic of the first substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to expandable substrate inspection systems with the ability to analyze substrates and sort the analyzed substrates based on characteristics determined during the analysis. The inspection system includes multiple metrology units adapted to analyze one or more characteristics of a substrate. The inspection systems may be utilized to identify defects on substrates and estimate cell efficiency prior to processing a substrate. Substrates may be transferred through the inspection system and/or between metrology units on a linear track or conveyor system (i.e., a main lane), and then sorted using an extension of the main lane and/or one or more linear conveyor systems placed at an angle relative to the main lane into respective bins based upon the inspection data. The sorting apparatus maintains a sorting capability of up to 5,400 substrates per hour, or greater, which is a marked increase over conventional linear sorting systems.

Figure 1:
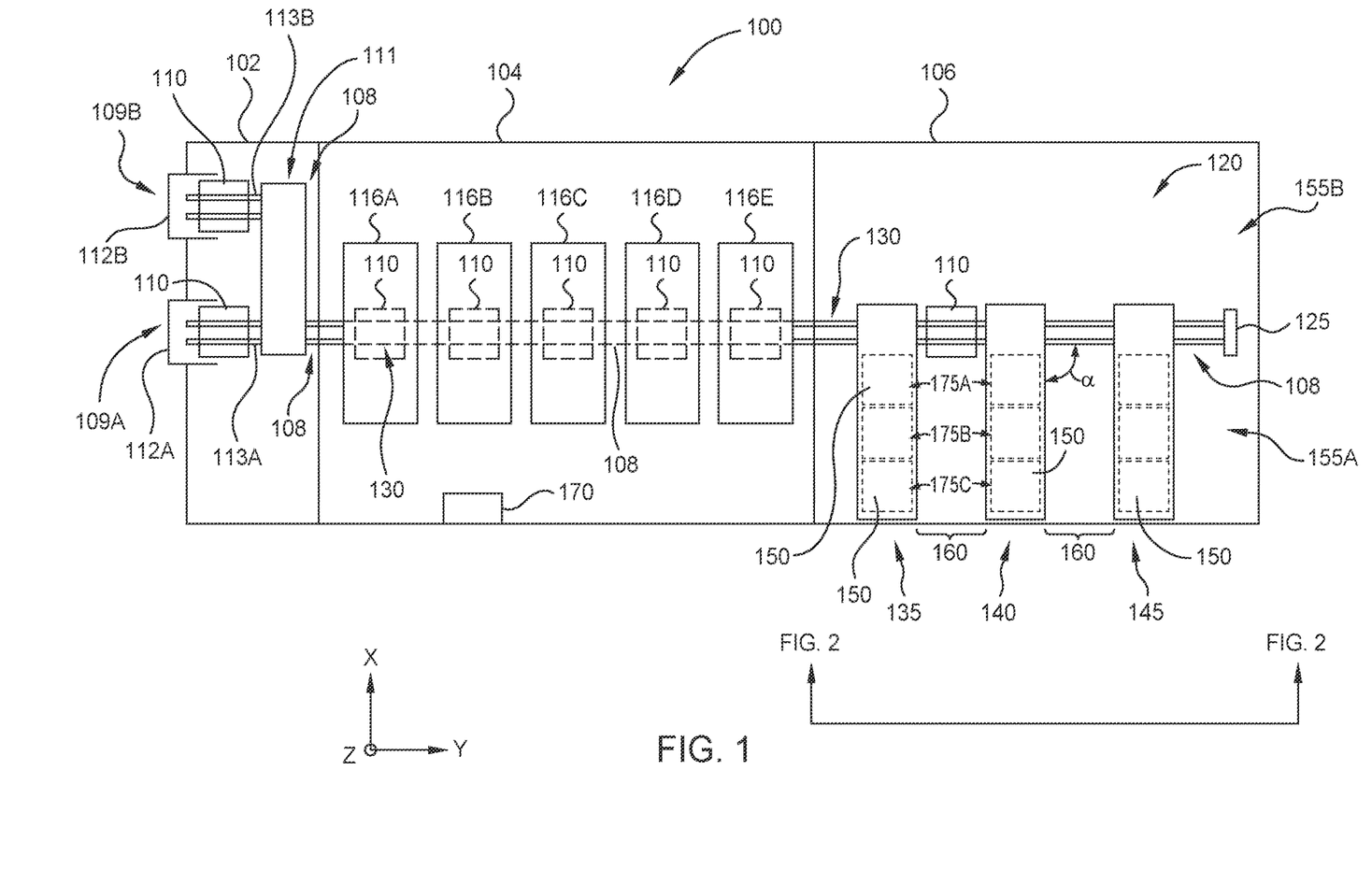
FIG. 1 illustrates a top plan view of an inspection system, according to one embodiment.

FIG. 1 illustrates a top plan view of an inspection system 100, according to one embodiment. The inspection system 100 includes a loading unit 102, a modular inspection unit 104, and a sorting unit 106. The loading unit 102 may be, for example, a loading station that provides un-analyzed (i.e., uninspected) substrates into the inspection system 100. The modular inspection unit 104 may be, for example, a metrology station that uses one or more metrology tools to inspect and/or analyze the substrates. The sorting unit 106 may be, for example a sorting station used to sort analyzed substrates from the modular inspection unit 104 into bins based on certain characteristics identified by the modular inspection unit 104. The loading unit 102, the modular inspection unit 104, and the sorting unit 106 may be, by way of example only, disposed linearly relative to another.

In one embodiment, the loading unit 102, the modular inspection unit 104, and the sorting unit 106 are connected in a serial arrangement such that a substrate may be easily and rapidly passed among the loading unit 102, the modular inspection unit 104 and the sorting unit 106 by the conveyor system 108 without exiting the inspection system 100. In this example, the loading unit 102, the modular inspection unit 104, and the sorting unit 106 are connected in a linear arrangement.

Each of the loading unit 102, the modular inspection unit 104 and the sorting unit 106 have a conveyor system 108 (a main conveyor) provided therein. The conveyor system 108 may include one or multiple conveyors such that substrates 110 are moved from the loading unit 102, through the modular inspection unit 104, to the sorting unit 106. For example, the conveyor system 108 may include a conveyor that is positioned in the loading unit 102, a conveyor that extends from the loading unit 102 into the modular inspection unit 104, and a conveyor that extends from the modular inspection unit 104 to the sorting unit 106. Alternatively, the conveyor system 108 may be a single conveyor that extends at least partially into the loading unit 102 through the modular inspection unit 104 to the sorting unit 106.

The loading unit 102 of the inspection system 100 includes a primary or first lane 109A having the conveyor system 108 substantially aligned therewith, and a secondary or second lane 109B that is offset laterally from the first lane 109A. A lateral transfer unit 111 is interfaced between the first lane 109A and the second lane 109B. The lateral transfer unit 111 is configured to move substrates from the second lane 109B to the first lane 109A.

The loading unit 102 receives a plurality of cassettes, such as a first cassette 112A and a second cassette 112B. Each of the first cassette 112A and the second cassette 112B contain a plurality of substrates 110 in a stacked configuration. The cassettes 112A and 112B may be positioned such that the substrates 110 are stacked one over the other within each of the first cassette 112A and the second cassette 112B. Each cassette is independently pivotable and/or linearly movable (at least in the X/Y plane and the Z direction) relative to the first conveyor 113A and/or the second conveyor 113B in order to transfer substrates therefrom.

Both of the first lane 109A and the second lane 109B include a conveyor, such as a first conveyor 113A and a second conveyor 113B, respectively. In some embodiments, both of the first conveyor 113A and the second conveyor 113B are separate and distinct from the conveyor system 108. However, the first conveyor 113A is aligned with the conveyor system 108 such that substrates may be seamlessly transfer from the first conveyor 113A directly to the conveyor system 108. The lateral transfer unit 111 is oriented in a cross-machine (i.e., orthogonal) direction relative to each of the first lane 109A and the second lane 109B. The lateral transfer unit 111 is utilized to transfer substrates from the second lane 109B to the first lane 109A. Any of the first conveyor 113A, the second conveyor 113B and the conveyor system 108 include belts or other continuous transfer medium using vacuum, electrostatic force, clamping or gravity to retain the substrates while transferring substrates thereon.

In operation, substrates 110 are transferred from the first cassette 112A positioned at the first lane 109A to the conveyor system 108 until all of the substrates 110 within the first cassette 112A are transferred (i.e., emptied). Then, substrates 110 from the second cassette 112B, positioned at the second lane 109B, are transferred to the second conveyor 113B. Substrates 110 from the second conveyor 113B travel to the first conveyor 113A and/or the conveyor system 108 using the lateral transfer unit 111. While the substrates 110 from the second cassette 112B are being loaded, the first cassette 112A, now empty, may be replaced with another cassette with new (uninspected) substrates, while the conveyor system 108 receives the substrates 110 from the second cassette 112B. Similarly, when the substrates 110 within the second cassette 112B have all been transferred to the second conveyor 113B, the second cassette 112B may be replaced with another cassette with new (uninspected) substrates while the conveyor system 108 receives the substrates 110 from the first cassette 112A via the lateral transfer unit 111.

The modular inspection unit 104 may include one or more metrology stations. In the embodiment of FIG. 1, the modular inspection unit 104 includes five metrology stations 116A-116E. It is contemplated that the inspection system 100 may also be modified by adding or subtracting metrology stations to the modular inspection unit 104, as space permits, rather than adding a second modular unit, thus increasing throughput and/or the number of metrology processes performed.

The metrology stations may include, by way of example only, any of the following: a micro-crack inspection unit, a thickness measuring unit, a resistivity measuring unit, a photoluminescence unit, a geometry inspection unit, a saw mark detection unit, a stain detection unit, a chip detection unit, and/or a crystal fraction detection unit. The micro-crack inspection unit may be, by way of example only, configured to inspect substrates for cracks, as well as to optionally determine crystal fraction of a substrate. The geometry inspection unit may be configured, by way of example only, to analyze surface properties of a substrate. The saw mark detection unit may be configured, by way of example only, to identify saw marks including groove, step, and double step marks on a substrate. The metrology stations may also include other examples beyond those listed above.

By further example and for purposes of illustration only, the metrology station 116B may be a thickness measuring unit adapted to measure substrate thickness. Metrology station 116B may also, or alternatively, measure resistivity of a substrate 110. The metrology station 116B receives substrates 110 transferred along the conveyor system 114 subsequent to inspection in the metrology station 116A, which may be any type of metrology station. The metrology station 116B is disposed along the in-line path of the substrates 110 defined by the conveyor system 114 downstream of the location of the metrology station 116A. The metrology station 116B performs one or more inspection processes on a substrate 110. The inspection process occurring at metrology station 116B may be performed while the substrate is in motion; however, it is contemplated that the motion of the substrate 110 may be stopped to facilitate increased accuracy of inspection.

By further example and for purposes of illustration only, the metrology station 116C may be a photoluminescence unit configured to detect defects and/or perform impurity measurements, and metrology station 116D may be a geometry inspection unit configured to analyze the geometry and surface properties of the substrate 110.

Metrology station 116C receives substrates 110 transferred along the conveyor system 114 subsequent to the inspection thereof in the metrology station 116B. Metrology station 116D receives substrates 110 transferred along the conveyor system 114 subsequent to the inspection thereof in the metrology station 116C. Metrology station 116E receives substrates 110 transferred along the conveyor system 114 subsequent to the inspection thereof in the metrology station 116D, and so forth if additional metrology units are utilized in a linear path as shown. Additionally, in some embodiments, non-linear path inspection may be utilized. As such, substrates 110 may be transferred between metrology stations 116A-116E in a non-linear fashion, such as in a circular fashion or in an arcuate fashion.

The conveyor system 108 conveys the inspected substrates 110 from the modular inspection unit 104 to the sorting unit 106. The conveyor system 108 may deliver inspected substrates 110 into the sorting unit 106 to a location within reach of a linear sorting system 120 housed with sorting unit 106. Additionally, the conveyor system 108 may continue through the sorting unit 106 to a connector 125. As such, if the sorting unit 106 is not sorting substrates 110 an inspected substrate 110 may bypass the linear sorting system 120 of the sorting unit 106. Furthermore, if an inspected substrate 110 is not classified into an assigned sorting bin by the linear sorting system 120 the substrate may continue along the conveyor system 114 toward the connector 125. In certain embodiments the sorting unit 106 may be further connected with additional units such as, by way of example only, additional inspection systems, additional sorting units, additional metrology units, etc. via the connector 125. The connector 125 may further allow the conveyor system 114 to align with a conveyor system of an additional unit such as, by way of example only, an additional inspection system, an additional sorting unit, an additional metrology units, a packaging system, etc. Alternatively, the connector 125 may transfer inspected substrates to storage bins (similar to the bins 150 described below).

The linear sorting system 120 includes the conveyor system 108 or may include a dedicated conveyor or track. The conveyor system 108 within the sorting unit 106 may be referred to hereinafter as a first conveyor lane 130. The first conveyor lane 130 is positioned linearly in the sorting unit 106. The first conveyor lane 130 is disposed in the X/Y plane within the sorting unit 106. At least one conveyor system, shown in FIG. 1 as a second conveyor lane 135, a third conveyor lane 140, and a fourth conveyor lane 145, are shown at least partially overlapping with the first conveyor lane 130. Each of the second conveyor lane 135, the third conveyor lane 140 and the fourth conveyor lane 145 are positioned at an angle α relative to a direction of the first conveyor lane 130. The angle α may be about 45 degrees to about 90 degrees (i.e., orthogonal) relative to the linear direction of the first conveyor lane 130. The angle α is selected to allow substrates 110 transferred from the first conveyor lane 130 to be moved laterally from the first conveyor lane 130 by the second conveyor lane 135, the third conveyor lane 140 and the fourth conveyor lane 145 to a position clear of the first conveyor lane 130. For example, to a position where a substrate 110 may be removed (i.e., picked up) from the first conveyor lane 130 transferred laterally by one of the second conveyor lane 135, the third conveyor lane 140 and the fourth conveyor lane 145.

Each of the second conveyor lane 135, the third conveyor lane 140 and the fourth conveyor lane 145 may be a dedicated conveyor or track, or include a robotic device adapted to selectively remove one or more substrates 110 from the first conveyor lane 130. Each of the second conveyor lane 135, the third conveyor lane 140 and the fourth conveyor lane 145 include one or more bins 150. Each of the bins 150 are adapted to receive one or more inspected substrates from the first conveyor lane 130. In one example, the second conveyor lane 135, the third conveyor lane 140 and the fourth conveyor lane 145 each include a vacuum conveyor belt adapted to selectively remove one or more inspected substrates from the first conveyor lane 130 and release the respective substrates into assigned sorting bins (i.e., the bins 150). While the operation of the second conveyor lane 135, the third conveyor lane 140 and the fourth conveyor lane 145 are positioned will be described below as an example, embodiments of the disclosure include robotic devices, such as pick and place devices, to be used instead of the vacuum conveyor belts.

Each of the second conveyor lane 135, the third conveyor lane 140 and the fourth conveyor lane 145 are oriented in the X/Y plane similar to the orientation of the first conveyor lane 130, but are offset from the plane of the first conveyor lane 130. In one example, the second conveyor lane 135, the third conveyor lane 140 and the fourth conveyor lane 145 are positioned in a plane above the plane of the first conveyor lane 130. In this example, substrates 110 being conveyed on the first conveyor lane 130 may pass under each of the second conveyor lane 135, the third conveyor lane 140 and the fourth conveyor lane 145 are positioned at an angle α relative to a direction of the first conveyor lane 130.

The linear sorting system 120 shown in FIG. 1 includes a first side 155A and a second side 155B of the first conveyor lane 130, and the second conveyor lane 135, the third conveyor lane 140 and the fourth conveyor lane 145 are positioned in the first side 155A. However, while not shown, additional conveyor lanes may be positioned on the second side 155B. In addition, while three conveyor lanes are shown, the disclosure is not limited as such and may include more than three, more than four, or more than five conveyor lanes. Also, the number of bins 150 interfaced with each conveyor lane is not limited to three, and can be any number of bins.

In some embodiments, the second conveyor lane 135, the third conveyor lane 140 and the fourth conveyor lane 145 are spaced laterally (in the direction of the first conveyor lane 130). An access space 160 between adjacent conveyor lanes allows personnel to access regions of the first conveyor lane 130 for repairs or inspection. In some embodiments, the access space 160 allows personnel or automatic equipment (i.e., a robot) to retrieve bins 150 for removal or replacement. Each of the bins 150 may be removable and/or replaced while the sorting unit 106 is in operation. The access space 160 may be about 1.5 feet to about 3 feet.

The inspection system 100 may also include a controller 170. The controller facilitates the control and automation of the system 100. The controller 170 may be coupled to or in communication with one or more of the conveyor system 108, the loading unit 102, the modular inspection unit 104, the sorting unit 106, and/or the metrology stations 116A-116E. The inspection system 100 may provide information to the controller 170 regarding substrate movement, substrate transferring, substrate sorting, and/or metrology performed. The controller 170 also controls movement of the first conveyor lane 130, the second conveyor lane 135, the third conveyor lane 140 and the fourth conveyor lane 145 to determine which bins 150 inspected substrates are to be transferred to.

The controller 170 may include a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position or location). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller 170 determines which tasks are performable on a substrate. The program may be software readable by the controller 170 and may include code to monitor and control, for example, the processing time and substrate position or location within the inspection system 100.

Each of the bins 150 of the second conveyor lane 135, the third conveyor lane 140 and the fourth conveyor lane 145 are discrete receptacles 175A-175C adapted to receive specific substrates 110 from the first conveyor lane 130 based on pre-determined characteristics determined by the modular inspection unit 104. For example, an analyzed (i.e., inspected) substrate having one characteristic (e.g., a first characteristic) based on metrological analysis in the modular inspection unit 104 would be routed to a first receptacle 175A of one of the second conveyor lane 135, the third conveyor lane 140 and the fourth conveyor lane 145. In another example, an inspected substrate having another characteristic (e.g., a second characteristic) based on metrological analysis in the modular inspection unit 104 would be routed to a second receptacle 175B of one of the second conveyor lane 135, the third conveyor lane 140 and the fourth conveyor lane 145. In another example, an inspected substrate having another characteristic (e.g., a third characteristic) based on metrological analysis in the modular inspection unit 104 would be routed to a third receptacle 175C of one of the second conveyor lane 135, the third conveyor lane 140 and the fourth conveyor lane 145. The first receptacles 175A (as well as the second receptacles 175B and third receptacles 175C) of each of the second conveyor lane 135, the third conveyor lane 140 and the fourth conveyor lane 145 are configured for substrates having different characteristics based on metrological analysis. Thus, the linear sorting system 120 as shown in FIG. 1 would be capable of classifying and/or receiving/holding inspected substrates based on 12 different characteristics. However, the number of receptacles in the linear sorting system 120 is not limited to the number shown, and may include sixteen receptacles, eighteen receptacles, or up to twenty (or more) receptacles.

Figure 2:
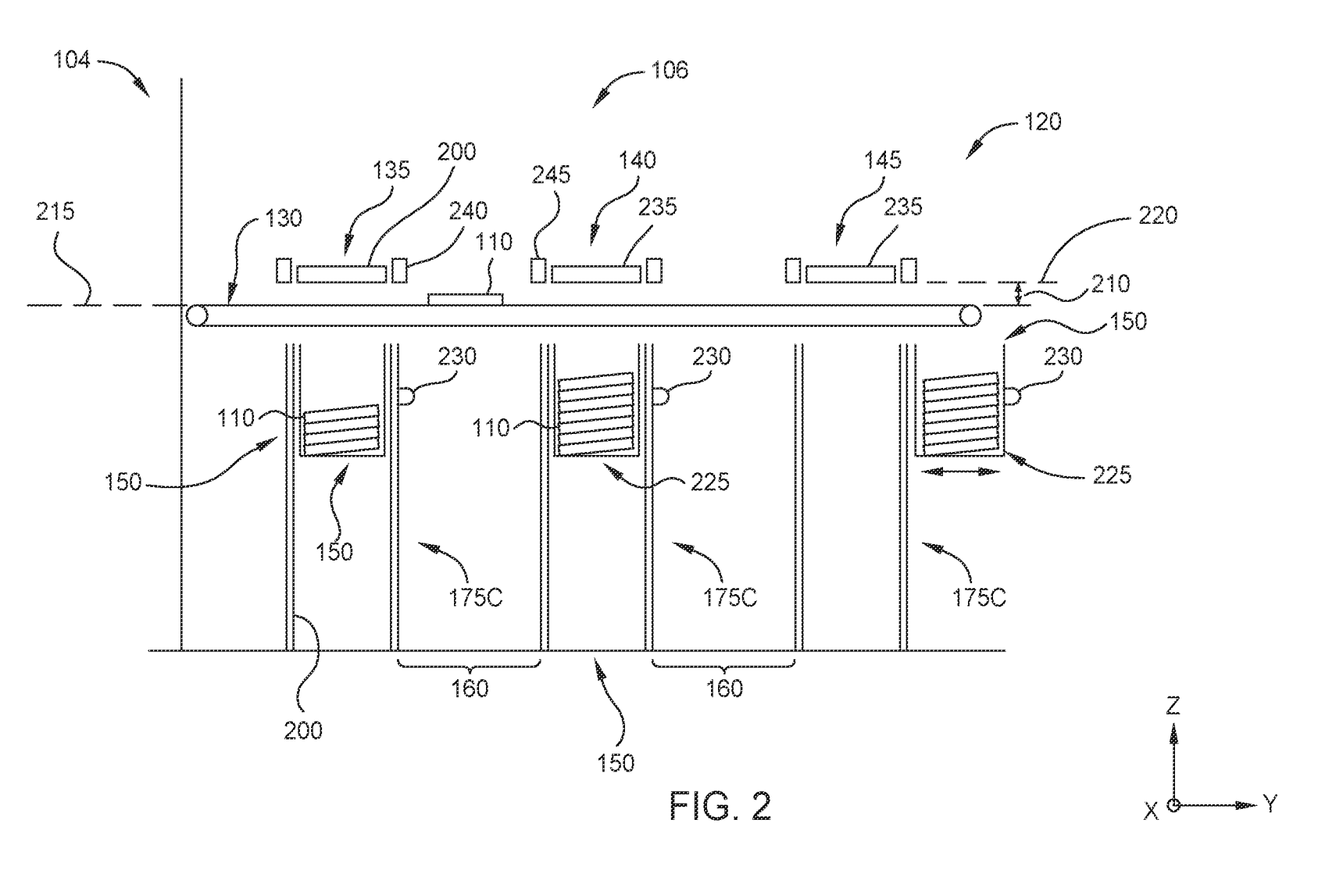
FIG. 2 is a side view of a portion of the inspection system along lines 2-2 of FIG. 1.

FIG. 2 is a side view of a portion of the inspection system 100 along lines 2-2 of FIG. 1. Specifically, the linear sorting system 120 of FIG. 1 is shown in a side view.

Each of the second conveyor lane 135, the third conveyor lane 140 and the fourth conveyor lane 145 include a lateral transfer unit 200. Each lateral transfer unit 200 is configured to selectively remove substrates 110 from the first conveyor lane 130. Each lateral transfer unit 200 is then configured to move a respective substrate 110 removed from the first conveyor lane 130 to an assigned bin 150 in a respective one of the second conveyor lane 135, the third conveyor lane 140 and the fourth conveyor lane 145.

At least a portion of each lateral transfer unit 200 is spaced away from and directly above the uppermost surface of the first conveyor lane 130 by a gap 210. The gap 210 is a vertical spacing (Z direction) which allows unimpeded movement of substrates 110 along the first conveyor lane 130 (in a first plane 215). The lowermost surface of each lateral transfer unit 200 is thus in a second plane 220 spaced vertically from the first plane 215. This allows substrates 110 to move below the lateral transfer unit 200 of any one of the second conveyor lane 135, the third conveyor lane 140 and the fourth conveyor lane 145 without interference from any of the lateral transfer units 200. However, when a particular substrate is to be removed from the first conveyor lane 130 for transfer into one of the bins 150 of the second conveyor lane 135, the third conveyor lane 140 or the fourth conveyor lane 145, the respective lateral transfer unit 200 removes said substrate from the first conveyor lane 130 and releases the substrate into a select one of the bins 150 along the respective second conveyor lane 135, third conveyor lane 140 and fourth conveyor lane 145.

The bins 150 are shown in third receptacles 175C that are resting on a floor of the inspection system 100. The bins 150 are adapted to receive multiple substrates 110 from the second conveyor lane 135, the third conveyor lane 140 and the fourth conveyor lane 145. The bins 150 are movably attached in each of the third receptacles 175C such that individual bins 150 may be removed or replaced by personnel. In one example, the bins 150 are removably attached to the third receptacles 175C by a cassette 225, configured as a drawer that is movable in the Y direction as shown on the fourth conveyor lane 145. Each cassette 225 includes a handle 230 allowing ease in movement and/or handling of a selected cassette 225. As stated above, each bin 150 (i.e., each cassette 225) may be removed and/or replaced while the inspection system 100 is in operation. For example, when a bin 150 is full, the cassette 225 may be removed and replaced with an empty cassette 225. The access space 160 allows personnel ingress and egress to the cassettes 225.

In one embodiment, each lateral transfer unit 200 comprises a vacuum conveyor 235. Each of the vacuum conveyors 235 include a drive motor 240 and a vacuum apparatus 245. The vacuum apparatus 245 is configured to selectively apply negative pressure thus enabling an individual substrate 110 to be removed from the first conveyor lane 130 and temporarily be secured by vacuum pressure to the lateral transfer unit 200. The drive motor 240 is utilized to move substrates 110 attached to the lateral transfer unit 200 in the X direction. Then, the vacuum apparatus 245 is selectively deactivated to allow substrate(s) 110 attached to the lateral transfer unit 200 to drop into the assigned bin 150. Operation of the lateral transfer unit 200 is described in more detail below. A base portion of the cassettes 225 may be angled such that the substrates 110 received therein are stacked in an orientation that is not parallel to the second plane 220 of the lateral transfer unit 200. This will be explained in more detail in FIG. 4.

Figure 3:
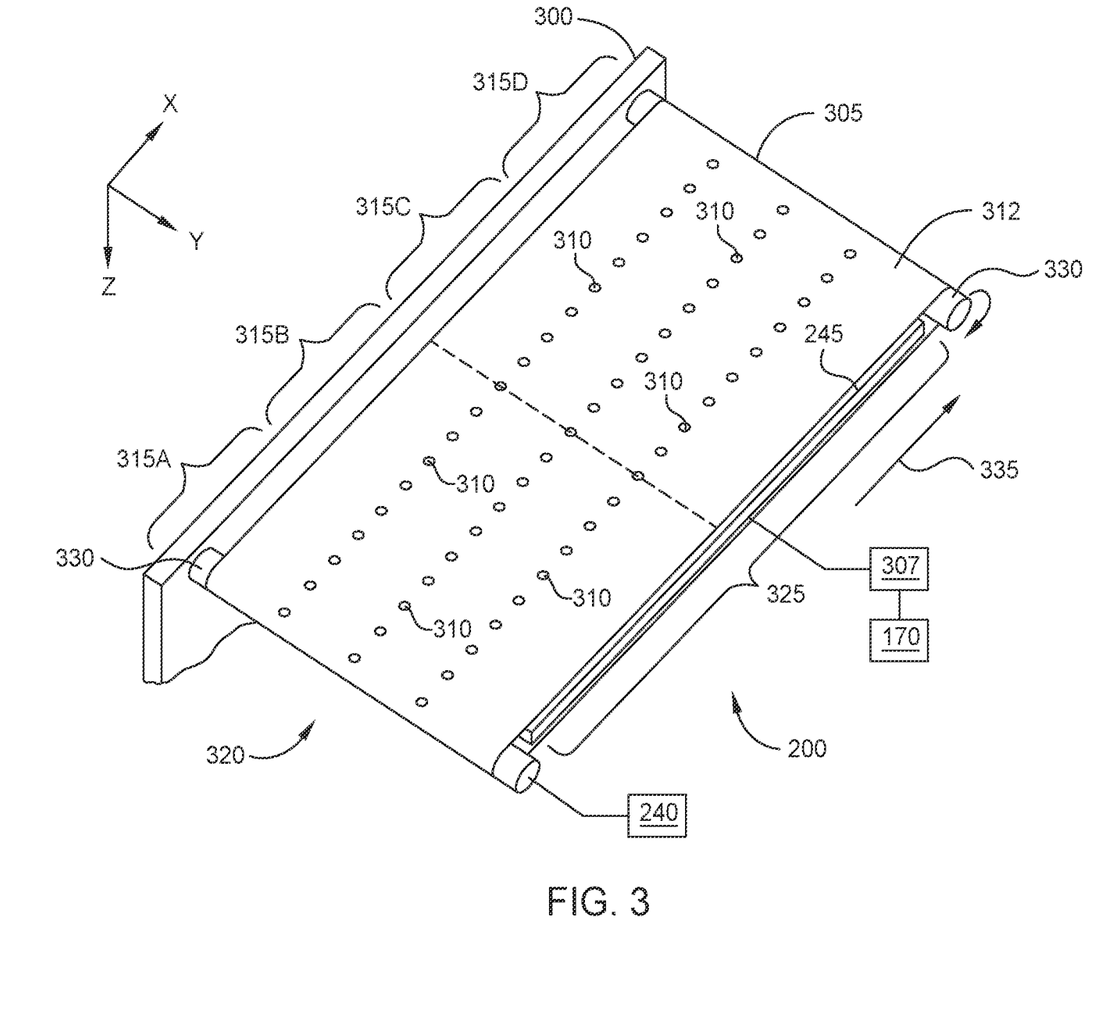
FIG. 3 is an isometric bottom view of one embodiment of a lateral transfer unit that may be used in the inspection system of FIG. 1.

FIG. 3 is an isometric bottom view of the lateral transfer unit 200. The lateral transfer unit 200 includes a support member 300 that is utilized to mount the lateral transfer unit 200 to the linear sorting system 120 (shown in FIGS. 1 and 2). The vacuum apparatus 245 is shown adjacent to a belt 305. The vacuum apparatus 245 is fluidly coupled to a pump 307 that facilitates application of a negative pressure (i.e., vacuum) to one or more plenums or chambers within the vacuum apparatus 245 where vacuum pressures can be selectively controlled or applied to holes or perforations 310 formed in the belt 305 (i.e., a vacuum belt). The pump 307 is coupled to the controller 170 such that suction forces (from the pump 307) along a lowermost surface 312 (i.e., a substrate receiving surface) of the belt 305 may be controlled. The vacuum is selectively applied to the lowermost surface 312 of the belt 305. Alternatively, the pump 307 may be a venturi device or other vacuum generating device.

The belt 305 is supported on at least two rollers 330 positioned at opposing ends of the lateral transfer unit 200. The drive motor 240 is operably coupled to one of the rollers 330 to move the belt 115 in a direction 335 (e.g., the X direction). The drive motor 240 may be operated such that the rollers 330 (and the belt 305) are constantly moving during operation of the linear sorting system 120. The vacuum apparatus 245 generally spans a length 325 of the lowermost surface 312 of the belt 305 but vacuum application along the lowermost surface 312 of the belt 305 may be varied during operation of the linear sorting system 120.

The vacuum apparatus 245 includes a plurality of sections such as a first section 315A, a second section 315B, a third section 315C, and a fourth section 315D. The first section 315A generally corresponds to a position where the first conveyor lane 130 passes thereunder. The second section 315B, the third section 315C, and the fourth section 315D generally correspond to positions of discrete bins 150 along lengths of the second conveyor lane 135, the third conveyor lane 140 and the fourth conveyor lane 145 (shown in FIG. 1). For example, each of the second section 315B, the third section 315C and the fourth section 315D generally correspond to a position of the receptacles 175A-175C (shown in FIG. 1), respectively. Each of the sections 315A-315D correspond to a plenum or chamber formed in the vacuum apparatus 245 where vacuum pressures can be controlled or applied through the perforations 310 formed in the belt 305.

The lateral transfer unit 200 includes a primary end 320 that extends over the first conveyor lane 130 (shown in FIGS. 1 and 2). By application of vacuum to the perforations 310 in the first section 315A from the vacuum apparatus 245, the substrate 110 is lifted off the first conveyor lane 130 and secured to the belt 305, allowing the substrate 110 to move laterally to a selected bin 150 without interfering with the motion of other substrates 110 on the first conveyor lane 130. The adhered substrate travels in the direction 335 to one of the second section 315B, the third section 315C, or the fourth section 315D based on instructions from the controller 170. The controller 170 includes instructions for the vacuum apparatus 245 to discontinue vacuum application (via the pump 307) such that the adhered substrate is selectively released in one of the second section 315B, the third section 315C, or the fourth section 315D.

In one example, if the adhered substrate is to be dismounted (i.e., released) from the lowermost surface 312 of the belt 305 and deposited into one of the second receptacles 175B of one of the second conveyor lane 135, the third conveyor lane 140 and the fourth conveyor lane 145, vacuum application to the third section 315C (corresponding to the position of the second receptacle 175B) is stopped (or reduced such that the weight of the substrate overcomes the vacuum force). This allows the previously adhered substrate to be released from the belt 305 and to fall (generally vertically) into the second receptacle 175B.

In another example, if an adhered substrate is to be released from the lowermost surface 312 of the belt 305 and deposited into one of the third receptacles 175C of one of the second conveyor lane 135, the third conveyor lane 140 and the fourth conveyor lane 145, vacuum application to the fourth section 315D (corresponding to the position of the third receptacle 175C) is reduced or stopped. This allows the previously adhered substrate to be released from the belt 305 and to fall (generally vertically) into the third receptacle 175C.

Figure 4:
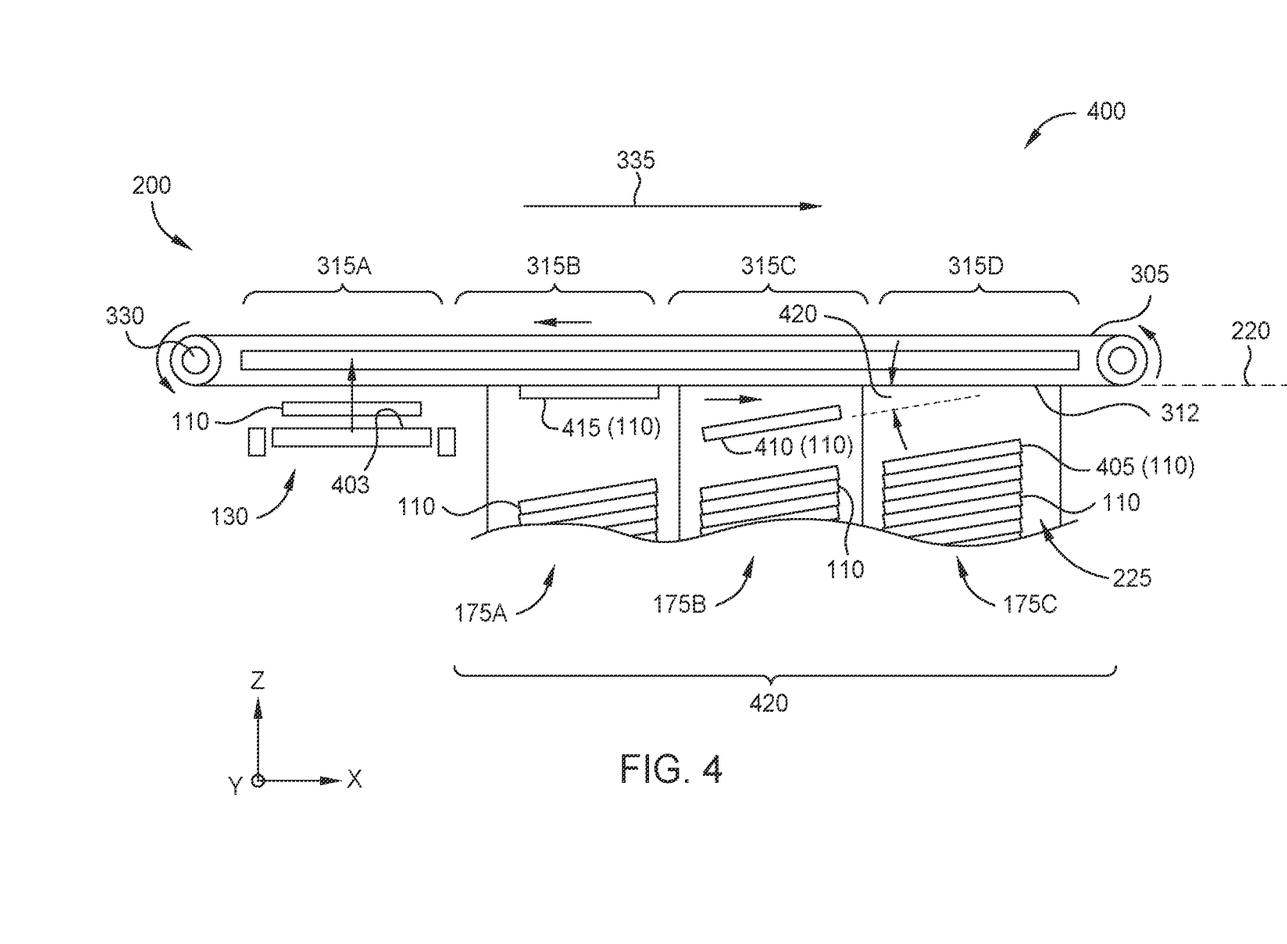
FIG. 4 is a schematic side view of a lateral transfer unit showing a substrate sorting sequence according to one embodiment.

FIG. 4 is a schematic side view of a lateral transfer unit 200 showing a substrate sorting sequence according to one embodiment. A conveyor lane 400 which may be any one of the second conveyor lane 135, the third conveyor lane 140 and the fourth conveyor lane 145 described and shown in other Figures.

In this example, substrates 110 travel on a transport surface 403 of the first conveyor lane 130 (only one substrate is shown) in the Y direction from the modular inspection unit 104 (shown in FIG. 1). Vacuum applied through the perforations 310 formed in the belt 305 lifts the substrate 110 from the transport surface 403 and secures the substrate 110 to the lowermost surface 312 of the belt 305 as shown by arrows. A first substrate 405, a second substrate 410 and a third substrate 415 are shown in the conveyor lane 400 after being removed from the first conveyor lane 130 by the first section 315A of the lateral transfer unit 200. The first substrate 405, the second substrate 410, and the third substrate 415 move laterally (in the direction 335) clear of (without interfering with) the transport surface 403 of the first conveyor lane 130.

Specifically, the third substrate 415 is shown adhered to the lowermost surface 312 of the belt 305 corresponding to the position of the first receptacle 175A and the second section 315B of the lateral transfer unit 200. The second substrate 410 is shown in a falling position into the second receptacle 175B after being released from the belt 305 (from the third section 315C) by stopping vacuum application. The first substrate 405 is shown resting on a plurality of stacked substrates 110 within the third receptacle 175C after being previously released from the belt 305 (from the fourth section 315D). Thus, the first substrate 405 and the second substrate 410 are transferred (i.e., sorted) into assigned bins (receptacles) based on characteristics determined in the modular inspection unit 104. The third substrate 415, which is still adhered to the belt 305, is also in transit to an assigned receptacle based on the metrological analysis characteristics. Based on the metrological analysis, the third substrate 415 may be released from the lowermost surface 312 of the belt 305 into the first receptacle 175A, the second receptacle 175B, or the third receptacle 175C. Release into the desired receptacle may be accomplished by controlling (i.e., stopping or reducing) vacuum application to the portion of the belt 305 in any one of the sections 315B-315D that is positioned over a desired bin. In one example, negative pressure can be selectively discontinued (stopped or reduced) in one section without discontinuing negative pressure in the other sections in order to release a substrate 110 into a desired receptacle.

As described above, in one embodiment, the substrates 110 received in the first receptacle 175A, the second receptacle 175B, or the third receptacle 175C are angled relative to the second plane 220 at least in the direction 335 (e.g., the X direction). The stack angle of the stacked substrates 110 may be substantially the same as a fall angle 420 of a released substrate 110 (such as the orientation of the second substrate 410). The fall angle 420 may be between about 0 degrees to about 10 degrees. The stack angle may be used to make major surfaces of the falling substrate and the stacked substrates substantially parallel. The parallel orientation of the major surfaces facilitates an "air cushion" to prevent breakage of substrates. In other embodiments, a gas jet (not shown) may be provided to rotate the falling substrate from the horizontal orientation so that the falling substrate becomes substantially parallel with the stacked substrates disposed in the bin. The parallelism of the falling substrate and the stacked substrates within the bin creates an air cushion that substantially prevents damage to the falling substrate and/or the stacked substrates.

Figure 5:
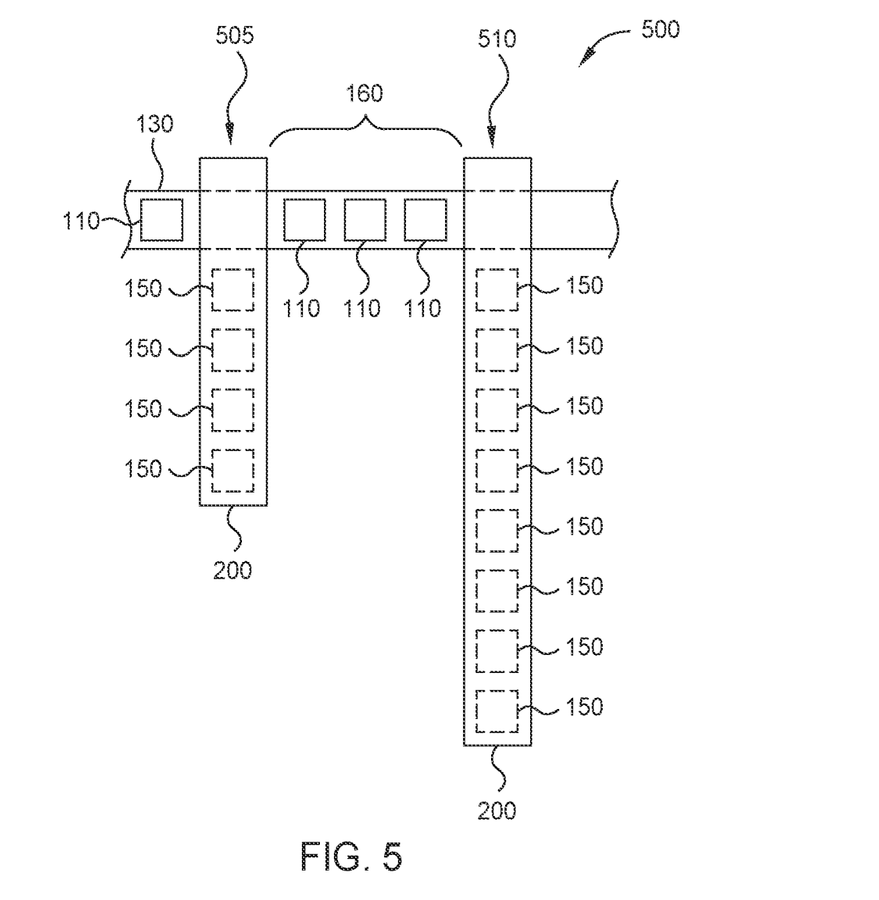
FIG. 5 is a schematic top view of another embodiment of a sorting unit that may be used in conjunction with, or in the place of, the sorting unit shown in the inspection system of FIG. 1.

FIG. 5 is a schematic top view of another embodiment of a sorting unit 500 that may be used in conjunction with, or in the place of, the sorting unit 106 shown in the inspection system 100 of FIG. 1.

In this embodiment, the sorting unit 500 includes the first (main) conveyor lane 130 as described above, as well as first sorting lane 505 and a second sorting lane 510. Both of the first sorting lane 505 and the second sorting lane 510 may be configured similarly to any one of the second conveyor lane 135, the third conveyor lane 140 and the fourth conveyor lane 145 with respect to the first conveyor lane 130 described and shown in other Figures. For example, each of the first sorting lane 505 and the second sorting lane 510 include the lateral transfer unit 200 and a plurality of bins 150. However, the first sorting lane 505 includes four bins 150, and the second sorting lane 510 includes eight bins 150. Thus, in the embodiment shown, substrates 110 may be sorted according to twelve characteristics. If more bins are needed, the first conveyor lane 130 may be expanded as necessary to include any number of additional bins. Additionally, more than two sorting lanes may be added to the sorting unit 500 in order to have additional sorting capacity.

The substrate sorting system disclosed provides for the sorting of substrates into appropriate sorting bins based on metrology inspection data received. The inspection system disclosed is expandable and may be used to detect a variety of substrate deficiencies prior to processing. The system may sort the inspected substrates received from the metrology unit using a linear sorter system as described herein. In one embodiment, a vacuum belt is provided to sort substrates into respective bins. The substrates released from the vacuum belt will fall gently into the sorting bin due to an "air cushion" (i.e., and air pillow), or air resistance between the falling substrate and the sorting bin. Optionally, a gas, such as air, may be provided under the falling substrate which may rotate the falling substrate, thus preventing any additional damage to the substrate(s).

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. An apparatus for sorting a plurality of substrates, the apparatus comprising:
    a first conveyor lane arranged in a first direction and a first plane, the first conveyor lane adapted to receive a plurality of substrates from a metrology unit;
    a second conveyor lane partially disposed over the first conveyor lane, wherein the second conveyor lane comprises a vacuum belt, the second conveyor lane oriented in a second direction relative to the first direction selected to allow a first substrate of the plurality of substrates transferred from the first conveyor lane to the second conveyor lane to move laterally clear of the first conveyor lane; and
    at least a third conveyor lane partially disposed over the first conveyor lane, wherein the third conveyor lane comprises a vacuum belt, the third conveyor lane oriented in the second direction relative to the first direction selected to allow a second substrate of the plurality of substrates transferred from the first conveyor lane to the third conveyor lane to move laterally clear of the first conveyor lane.

2. The apparatus of claim 1, wherein the vacuum belt of the first conveyor lane includes a plurality of sections where negative pressure can be selectively discontinued in one section without discontinuing negative pressure in other sections.

3. The apparatus of claim 2, wherein the second conveyor lane includes a plurality of bins disposed below the second conveyor lane.

4. The apparatus of claim 3, wherein a first section of the sections of the vacuum belt of the first conveyor lane corresponds to a position of ono over a first bin of the plurality of bins.

5. The apparatus of claim 1, wherein the second conveyor lane includes a plurality of bins.

6. The apparatus of claim 5, wherein each of the plurality of bins are removable relative to the second conveyor lane.

7. The apparatus of claim 1, wherein the second conveyor lane and the third conveyor lane are positioned in a second plane that is different than the first plane.

8. An apparatus for inspecting and sorting a plurality of substrates, the apparatus comprising:
    a metrology unit;
    a first conveyor lane arranged in a first direction and a first plane, the first conveyor lane configured to receive a plurality of substrates from the metrology unit;
    a second conveyor lane partially disposed over the first conveyor lane, the second conveyor lane operable to vacuum transfer a first substrate of the plurality from the first conveyor line to the second conveyor lane, the second conveyor lane oriented in a second direction relative to the first direction selected to allow the first substrate transferred from the first conveyor lane to the second conveyor lane to move laterally clear of the first conveyor lane; and
    at least a third conveyor lane partially disposed over the first conveyor lane, the third conveyor lane operable to vacuum transfer a second substrate of the plurality from the first conveyor line to the third conveyor lane, the third conveyor lane oriented in the second direction relative to the first direction selected to allow the second substrate transferred from the first conveyor lane to the third conveyor lane to move laterally clear of the first conveyor lane.

9. The apparatus of claim 8, wherein the first conveyor lane has a first side and a second side opposing the first side, and the second conveyor lane is positioned on the first side.

10. The apparatus of claim 9, wherein the second conveyor lane is positioned on the first side.

11. The apparatus of claim 8, wherein the vacuum belt of the first conveyor lane includes a plurality of sections where negative pressure is individually controlled.

12. The apparatus of claim 11, wherein the second conveyor lane includes a plurality of bins.

13. The apparatus of claim 12, wherein each of the sections of the vacuum belt of the first conveyor lane corresponds to a position of one of the plurality of bins.

14. The apparatus of claim 8, wherein the second conveyor lane and the third conveyor lane are positioned in a second plane that is different than the first plane.

15. A method for sorting a plurality of substrates, the method comprising:

transporting the plurality of substrates on a main conveyor lane exiting a metrology unit in a first direction;

vacuum picking a first substrate of the plurality of substrates from the main conveyor lane to a first sorting lane;

transporting the first substrate laterally clear of the main conveyor lane;

vacuum picking a second substrate of the plurality of substrates from the main conveyor lane to a second sorting lane; and transporting the second substrate laterally clear of the main conveyor lane.

16. The method of claim 15 further comprising:

releasing the first substrate into a selected bin of a plurality of bins based on an inspection characteristic of the first substrate, wherein the first sorting lane at least partially overlies the main conveyor lane and the plurality of bins.

17. The method of claim 15, wherein the first sorting lane comprises a vacuum belt, and wherein the vacuum belt includes a plurality of sections where negative pressure is individually controlled.

18. The method of claim 17, wherein negative pressure can be selectively discontinued in one section without discontinuing negative pressure in other sections.

* * * * *